United States Patent
Marquis et al.

(10) Patent No.: US 6,614,725 B2
(45) Date of Patent: Sep. 2, 2003

(54) TIMEPIECE COMPRISING MEANS FOR ALLOWING ELECTRIC ACCESS TO ELECTRIC OR ELECTRONIC COMPONENTS OF THIS TIMEPIECE

(75) Inventors: Roger Marquis, Courchapoix (CH); Baptist Wyssbrod, Bienne (CH); Stéphane Claude, Grenchen (CH)

(73) Assignee: Eta SA Fabriques d'Ebauches (CH)

( * ) Notice: Subject to any disclaimer, the term of this patent is extended or adjusted under 35 U.S.C. 154(b) by 51 days.

(21) Appl. No.: 09/997,125

(22) Filed: Nov. 27, 2001

(65) Prior Publication Data

US 2002/0064098 A1 May 30, 2002

(30) Foreign Application Priority Data

Nov. 29, 2000 (CH) ............................................... 2322/00

(51) Int. Cl.[7] ........................... G04B 37/00; G04B 1/00; G04C 3/00
(52) U.S. Cl. .......................................... 368/88; 368/204
(58) Field of Search .......................... 368/88, 276, 281, 368/203, 204

(56) References Cited

U.S. PATENT DOCUMENTS

| 4,407,590 A | * | 10/1983 | Ohno et al. | 368/204 |
| 4,763,308 A | * | 8/1988 | Morata | 368/88 |
| 5,787,054 A | * | 7/1998 | Yasukawa et al. | 368/204 |

* cited by examiner

Primary Examiner—Vit Miska
(74) Attorney, Agent, or Firm—Richard K Robinson

(57) ABSTRACT

There is disclosed a timepiece (1) powered by an electric power source formed by a battery (P) including a case (2, 21, 22), a battery compartment (7) formed by a housing (6) arranged inside said case to accommodate the battery, and means for closing the housing including a removable cover (8) able to be mechanically locked onto the case. The timepiece further includes connecting means (10, 11), arranged partly in said housing, for allowing electric access to electric or electronic components of the timepiece housed within the case. These connecting means include a plurality of connection terminals (10) arranged in the housing at the periphery of the battery, this housing being arranged so that the connection terminals are accessible from outside the case after the removal of the removable cover, without requiring the battery to be removed from its housing.

9 Claims, 3 Drawing Sheets

TIMEPIECE COMPRISING MEANS FOR ALLOWING ELECTRIC ACCESS TO ELECTRIC OR ELECTRONIC COMPONENTS OF THIS TIMEPIECE

The present invention relates generally to a timepiece powered by an electric power source formed by a battery and comprising in particular connecting means allowing electric access to electric and/or electronic components housed inside said timepiece.

During the manufacturing process of a timepiece of the electric or electromechanical type, it is common for operating tests to be performed on the assembled electric or electronic components. These test are commonly repeated at different stages of manufacture of the timepiece. During this manufacturing process, it is generally easy to test these components because they are either accessible directly, or via connection terminals provided specifically for this purpose on the electronic module of the timepiece. In addition to these tests, various adjustments of the timepiece functions are also made, such as for example adjustment of the time, the position of the hands or any other time-related or non time-related function of the timepiece.

One problem lies in the fact that, at a final stage of manufacture of the timepiece, electric access to the various components which are housed therein is greatly reduced. During a subsequent inspection of the timepiece, for example by an after-sales service, electric access to the components often requires the timepiece to be dismantled. Typically, this electric access to the components is made by removing the back cover of the timepiece case. It will be understood that these manipulations are tedious and make subsequent inspections of the timepiece long and difficult. Dismantling the timepiece case is no longer possible in all cases, for example when the middle part and the back cover of the case are made in a single piece and the crystal is welded or bonded onto the middle part.

Solutions which do not require the timepiece to be dismantled in order to have electric access to the components housed therein are known. Swiss Patent No 664 868 in the name of EM Microelectronic-Marin SA discloses for example a device allowing a non-volatile memory arranged inside a timepiece case to be programmed. According to this patent, such programming is achieved via battery connecting tongues which are advantageously disposed inside a battery compartment formed by a housing arranged inside the case, this housing being commonly closed by a closing mechanism including a removable cover.

This solution has the advantage of requiring practically no dismantling of the timepiece in order to access the components, except for dismantling the removable cover of the battery compartment. This solution is also advantageous in the sense that the sealing of the timepiece case is not compromised, such sealing being normally guaranteed once the closing mechanism is set back in place again.

Nonetheless, one drawback of the solution disclosed in the aforementioned Swiss Patent No. 664 868 lies in the fact that the possibility of electric access to the electric or electronic components of the timepiece is limited by the reduced number of connection terminals available, namely the two battery connecting tongues. Although it is possible to provide the timepiece with specific means allowing a signal applied across the connecting tongues of the battery to be interpreted, these interpreting means quickly become complex, in particular when the tests or adjustments which one wishes to perform are numerous.

Another drawback of the solution disclosed in the aforementioned Swiss Patent No. 664 868 lies in the fact that it is necessary to remove the battery from its housing in order to access the battery connecting tongues. Although this fact is not in itself a problem when one wishes to programme a non-volatile memory, as is the case in Swiss Patent No. 664 868, this memory preserving stored data even when the power supply is interrupted, the same is not true when one wishes to adjust the time, for example, such an adjustment being itself volatile. The timepiece of the aforementioned patent thus necessarily requires the use of retention means, such as a buffer capacitor, to keep information of a volatile nature in the memory.

An object of the present invention is to propose a timepiece provided with means allowing easy electric access to the electric or electronic components of the timepiece, these access means not compromising the sealing of the timepiece.

Another object of the present invention is to propose a timepiece including such electric access means which require neither any substantial dismantling of the timepiece nor complicated handling by the operator.

Another object of the present invention is to propose a timepiece which does not require the battery to be removed in order to allow electric access to the electric or electronic components of the timepiece.

The present invention thus concerns a timepiece the features of which are listed in claim 1.

Advantageous embodiments form the subject of the dependent claims.

More generally, the present invention also concerns an electronic module intended to be mounted in an electronic or electromechanical device the features of which are listed in claim 8.

The solution proposed by the present invention thus allows quick and easy electric access to the electric and/or electronic components of the timepiece because the connecting means allowing electric access to these components open out inside the battery housing, the access being simply made after the removable cover of the battery compartment has been removed. The sealing of the timepiece is thus not comprised by the arrangement of the access means, such sealing being assured by the closing mechanism of the battery compartment.

The solution according to the invention advantageously allows a test or adjustment of the timepiece components to be effected at a final manufacturing stage of the timepiece or during a subsequent check by an after-sales service for example. Substantial tests of the components and subsequent adjustments to the timepiece functions can thus be effected without it being necessary to dismantle the timepiece significantly.

The solution according to the invention also advantageously allows data to be entered, extracted from or exchanged with the timepiece, for example in order to program certain of the timepiece functions.

Furthermore, because the access means include a plurality of connection terminals arranged at the periphery of the battery, access to the electric and/or electronic components does not require the battery to be removed. It is thus not necessary to provide the timepiece with retention means, such as a buffer capacitor, to preserve volatile data when the battery is set in place.

Other features and advantages of the invention will appear more clearly upon reading the following detailed description, made with reference to the annexed drawings, given by way of non limiting examples in which.

Figure 1:
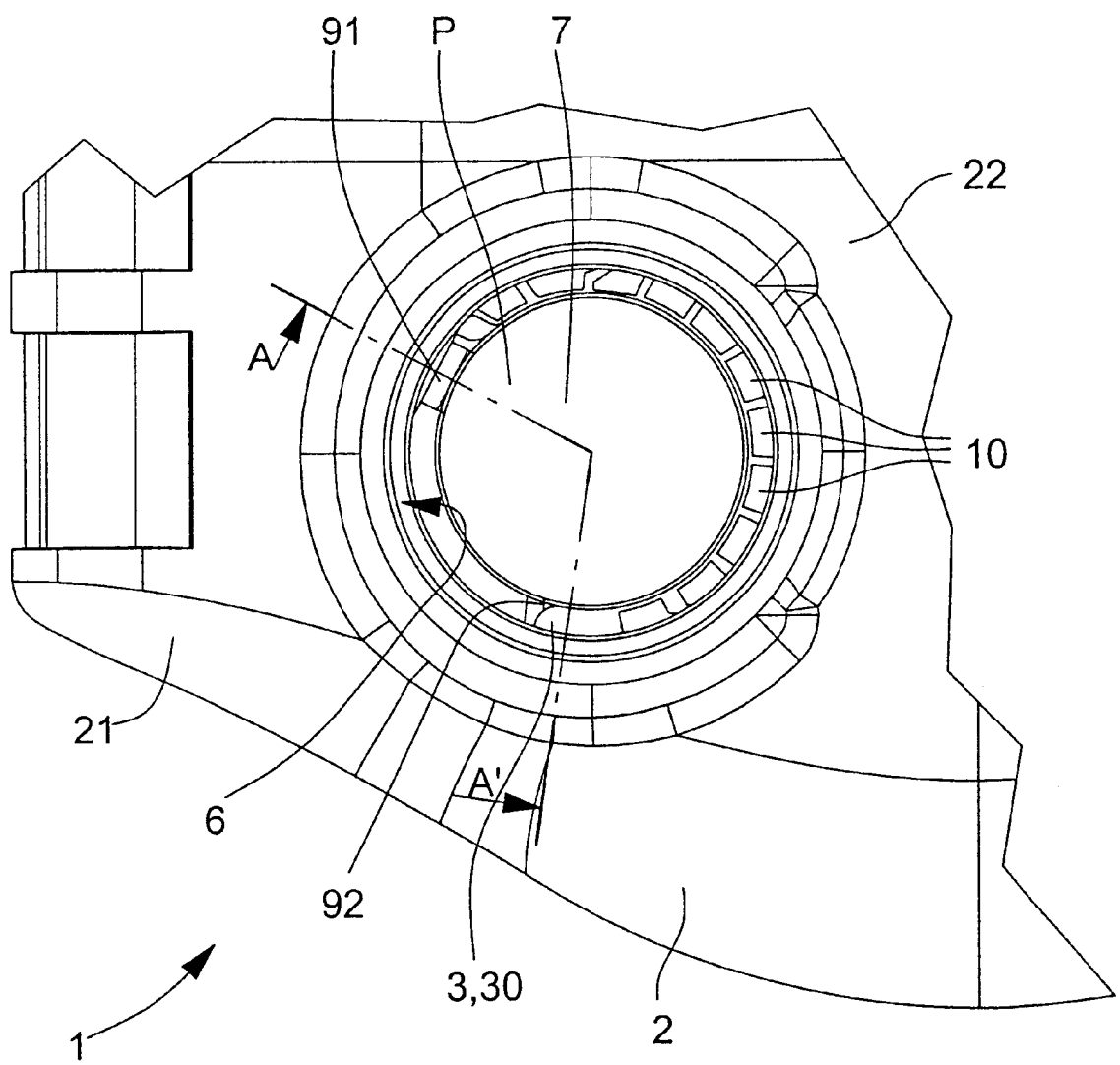
FIG. 1 shows a partial plan view of the back of a timepiece showing the battery compartment, without the battery compartment cover, and the arrangement of the connection terminals according to the invention.
Figure 2:
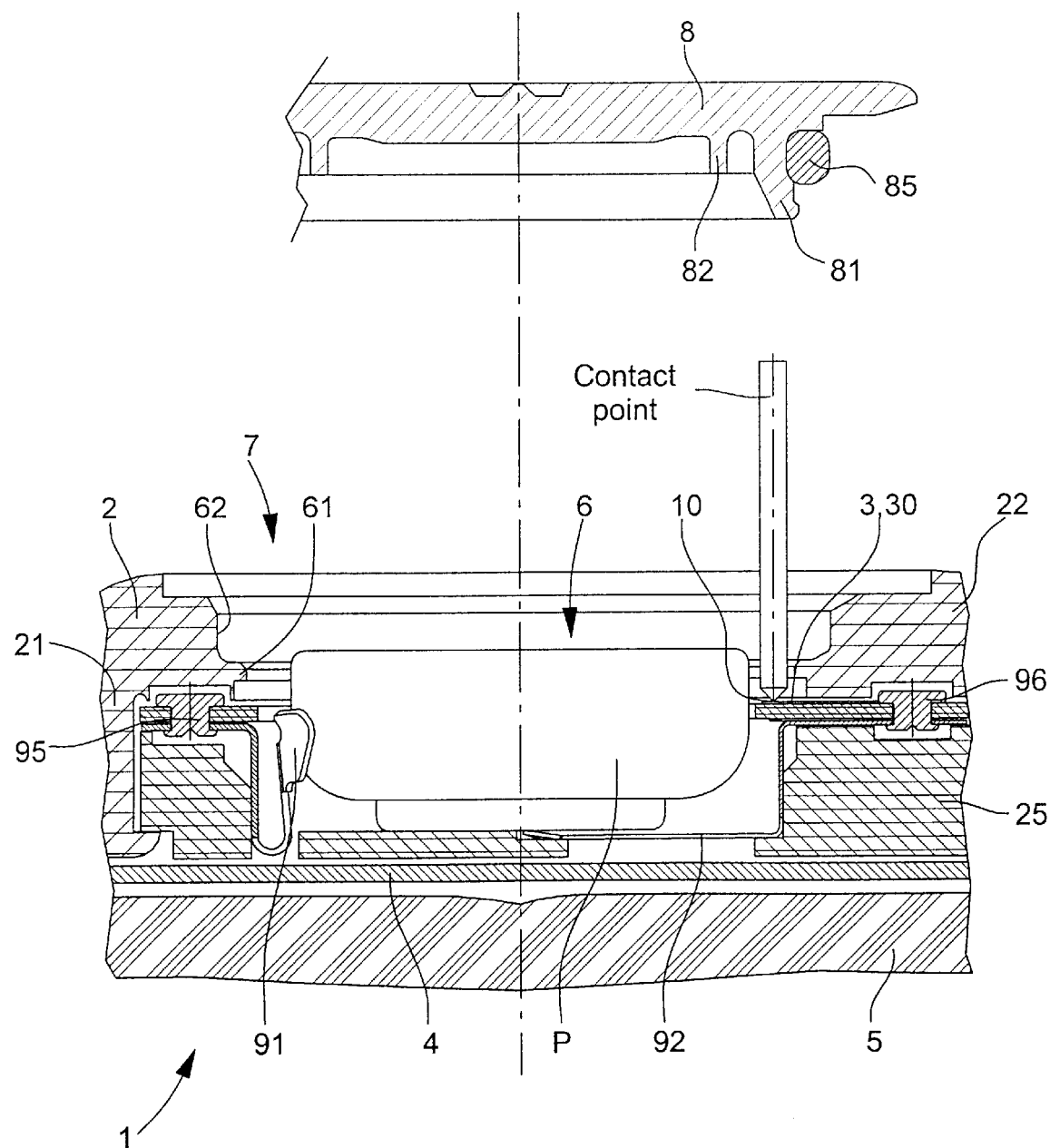
FIG. 2 shows a partial cross-section of the timepiece, taken along the line A-A' of FIG. 1.

With reference first of all to FIGS. 1 and 2, the latter being a partial cross-section along the line A-A' of FIG. 1, a battery-powered timepiece is shown including connecting means, according to the present invention, for allowing electric access to electric and/or electronic components housed inside the timepiece. This timepiece, indicated generally by reference numeral 1, includes in particular a case 2 formed of a middle part 21 and a back cover 22 formed of a single piece, a movement (not shown) (not shown) housed inside case 2 and including in particular an electronic module 3 (FIG. 2) formed on a printed circuit 30, a dial 4, and a crystal 5. FIG. 2 also shows an additional element of the movement, indicated by the reference numeral 25. This element 25 is in particular an upper plate of the movement which, as can be observed here, forms a support against which electronic module 3 is supported. The structure of the movement of timepiece 1 illustrated here will not be described in detail, since it does not form the subject of the invention and is not necessary in order to achieve the invention.

Case 2 and crystal 5 are for example made of a plastic material such as acrylonitrile butadiene styrene known under the acronym ABS and a transparent acrylic resin such as PMMA, respectively. Crystal 5 is for example assembled on case 2 by a conventional welding method so that case 2 and crystal 5 form a substantially sealed structure, which cannot be dismantled at least in a non destructive manner. The interested reader may refer to European Patent No. 0 101 663, in the name of the Applicant, for a detailed description of a technique for heat welding of a crystal onto a watch case.

It will be understood nonetheless that the structure which has just been described in no way limits the application of the present invention. This invention is perfectly applicable by analogy to any type of battery-powered timepiece including a removable or non-removable back cover, provided the timepiece includes a battery compartment formed by a housing arranged inside the case to accommodate the battery, and means for closing the housing including a removable cover able to be mechanically locked onto case. The reader may refer in particular to European Patent No. 0 597 357, in the name of the Applicant, to obtain a description of a timepiece including such a battery compartment and means for closing said battery compartment.

The battery compartment closing mechanism which will now be described with reference to FIGS. 1 and 2 differs slightly from the mechanism disclosed in the aforementioned European Patent No. 0 597 357. It will easily be understood that various battery compartment closing mechanisms may be envisaged.

FIG. 2 shows a plan view of a housing 6 arranged in case 2 and forming a battery compartment 7 accommodating an electric power source formed by a battery P. For the purposes of illustration, the removable cover of battery compartment 7 is not shown in FIG. 1. This removable cover, indicated by reference numeral 8, is however, illustrated in FIG. 2.

This removable cover 8 may also be made, in a non limiting manner, of plastic material. We will not dwell any longer on the structure of this cover 8, since it does not form the subject of the present invention. However, it should be noted that this removable cover 8 includes a first annular lip 81 conformed to an edge 61 of the battery compartment housing and a second annular lip 82 intended to abut against a face of battery P in order to hold the latter in housing 6. An O-ring joint 85 is also arranged around first annular lip 81 in order to assure the sealing of battery compartment 7. When closed, this O-ring joint 85 is in particular compressed between annular lip 81 and a substantially cylindrical wall 62 of housing 6.

As illustrated in FIG. 2, two connecting tongues 91, 92 which respectively come into contact with the positive and negative poles of battery P are arranged in housing 6 of battery compartment 7. These connecting tongues 91, 92 are both connected to power supply paths (not shown) made on printed circuit 30 of electronic module 3 of the timepiece. In the illustration of FIG. 2, these connecting tongues 91, 92 are for example fixed to printed circuit 30 by rivets 95, 96 respectively.

According to the present invention, timepiece 1 includes connecting means, arranged partly in housing 6, allowing electric access to electric and/or electronic components of the timepiece housed in case 2. These electric and/or electronic components are not illustrated in FIGS. 1 and 2, but it will easily be understood that these components can include one or more motors driving analogue display members, one or more display cells, memory means such as a RAM, ROM or a re-programmable memory such as an EEPROM, an oscillator circuit (and its quartz), a frequency division chain, an integrated circuit of the movement, or any other electric or electronic component capable of being housed inside case 2.

It will be understood that it is desirable to have access to the integrated circuit of the timepiece movement, in particular for the purpose of adjusting certain time-related functions, for example in order to adjust the time or to adjust several time zones, or non time-related functions, for example in order to adjust the positions of the hands of an analogue display.

It is also desirable to have access to the electric or electronic components of the timepiece movement in order to test the functioning thereof, for example in order to test a display cell, or to test the functioning of the motors and associated wheels and pinions.

Finally, access to the components of the timepiece movement may for example be for the purpose of entering, extracting or exchanging data with the timepiece memory means. Programming a memory storing the division rate correction factor of the division chain generating the clock signal of the movement may for example be effected in the manner shown in Swiss Patent No. 664 868 mentioned in the preamble.

According to the present invention, and again with reference to FIGS. 1 and 2, the connecting means include a plurality of connection terminals 10, which, in a non limiting manner, are eleven in number in this example, arranged in housing 6 at the periphery of battery P. Housing 6 is in particular arranged so that connection terminals 10 are accessible from outside case 2, after the removal of removable cover 8. The diameter of battery compartment housing 6 is thus substantially larger than the diameter of battery P in order to allow access to connection terminals 10.

As will have been understood, contact with connection terminals 10 does not require the removal of the battery from its housing 6, these connection terminals 10 being able for example to be contacted by a suitable contact tip as is illustrated in the cross-section of FIG. 2. Advantageously, a multiple contact connector, shaped to fit housing 6 of battery compartment 7, could be used to contact in parallel all of connection terminals 10. An advantage of the present invention also lies in the simplicity of the arrangement of connection terminals 10.

The movement may thus be continually powered by battery P, even when one wishes to test the components or adjust the movement functions. However, if necessary, two connection terminals from among connection terminals 10 may be contacted in order to power the movement and to allow, in particular, battery P to be changed. Means for retaining the timepiece data, formed for example of a buffer capacitor, are thus a priori no longer necessary to retain certain settings in the memory such as the time and date for example.

Preferably, as can be seen in FIG. 2, printed circuit 30 of electronic module 3 is arranged in a substantially identical plane to the plane of battery P. Unlike conventional structures in which the printed circuit of the electronic module is arranged behind the battery, the arrangement of FIG. 2 thus allows an optimum use of the space in timepiece case 2.

Figure 3:
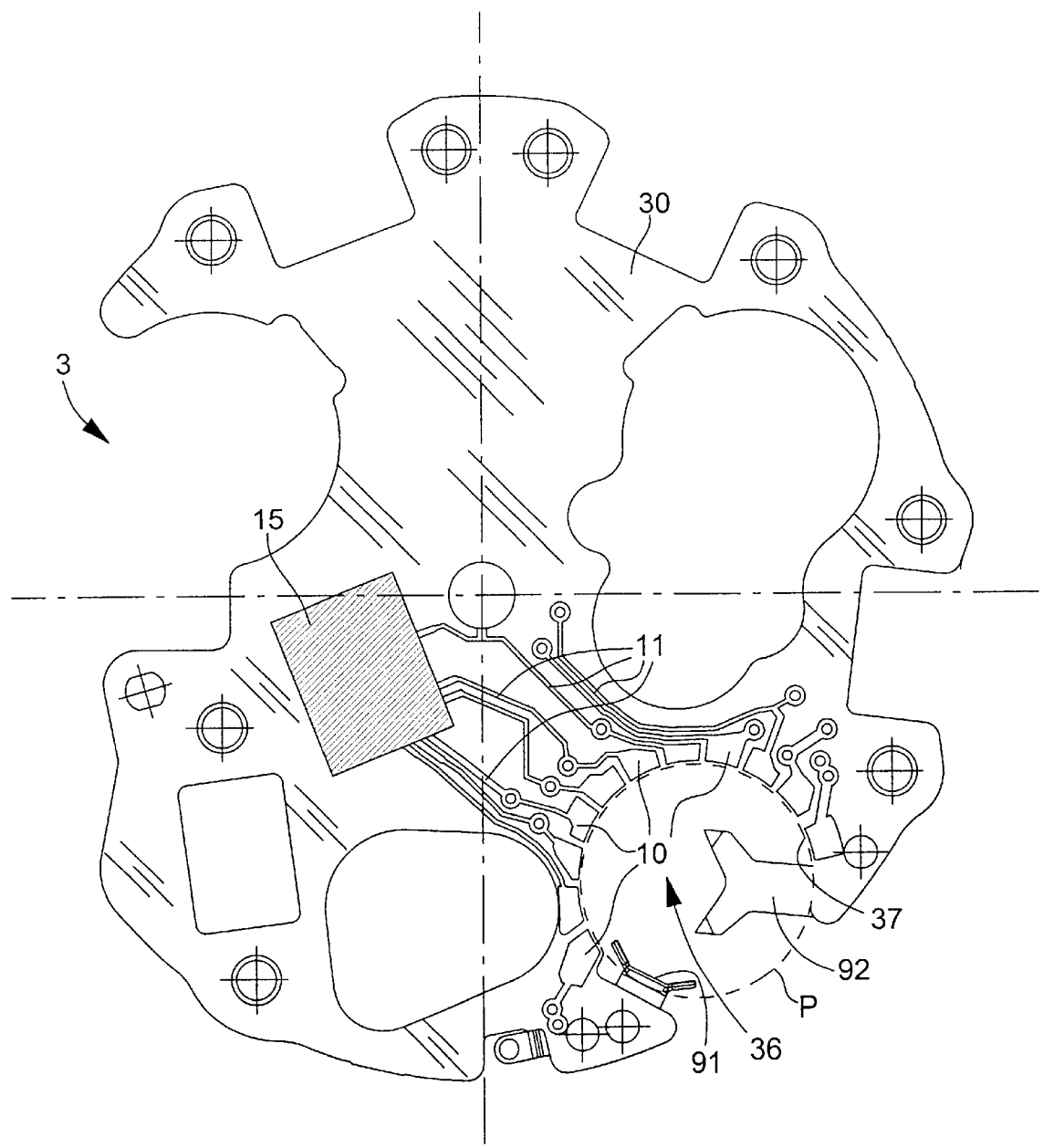
FIG. 3 shows a plan view of an electronic module of the timepiece illustrated in FIGS. 1 and 2.

Reference will now be made to FIG. 3 which shows a schematic plan view of a non limiting example of electronic module 3 of the timepiece illustrated in FIGS. 1 and 2. It will be noted that the view illustrated in FIG. 3 is a view of the back of the electronic module, i.e. a view of electronic module 3 as taken from back cover 22 of the timepiece in the direction of dial 4 in FIG. 2.

In FIG. 3, a plurality of conductive paths 11 can thus be seen, made on printed circuit 30 and leading respectively to connection terminals 10 of battery compartment 7. Preferably, conductive paths 11 lead to an integrated circuit of the movement, indicated by reference 15. Most of the electric or electronic components are generally operationally linked to the integrated circuit of the movement, so that a test of the various components may typically be effected via this integrated circuit. It will be understood that one may nonetheless envisage making paths leading directly to a component of the timepiece, such as the quartz for example, without it being necessary to pass through an intermediate component of the movement such as integrated circuit 15.

More specifically, electronic module 3 includes an opening 36 shaped to fit the periphery (cylindrical portion) of battery P, and at the periphery 37 of which connection terminals 10 are arranged.

It will also be understood that pre-defined test routines may be stored in the integrated circuit so as effect standard tests of the various components of the movement. In particular, the connection terminals may give access to a serial port of integrated circuit 15 via which a test number is sent to integrated circuit 15. The possibilities offered by the present invention for performing tests or making adjustments to the electric and/or electronic components of the movements are thus practically infinite.

By way of alternative, one may perfectly well envisage providing a decoding logic including all or part of connection terminals 10 as inputs. Given the fact that a relatively high number of connection terminals may be made in battery compartment 7, this number being limited only by constraints of a geometrical nature, the number of encoding possibilities is practically infinite. In this idea, routines corresponding to the various encoding possibilities available may be pre-defined and stored, and executed automatically via the application, on connection terminals 10, of suitable binary signals.

It will thus have been understood that the arrangement according to the present invention offers broad application possibilities, in particular because of the high number of connection terminals 10 which can be made in battery compartment 7. The arrangement of the connection terminals according to the present invention is also particularly advantageous in the sense that these terminals are all arranged in a same plane and in a narrow zone. Contact with these terminals may thus be easily achieved from outside case 2. The sealing of the arrangement is further perfectly assured by the closing mechanism of the battery compartment.

It will be understood that various modifications and/or adaptations may be made to the embodiment disclosed in the present invention without departing from the scope of the annexed claims. In particular, it will be understood that the closing mechanism of the battery compartment which has been described, may be replaced by any other equivalent closing mechanism, such as a bayonet mechanism, for example, as disclosed in the aforementioned European Patent No. 0 597 357.

What is claimed is:

1. A timepiece powered by an electric power source formed by a battery including a case, a battery compartment formed by a housing arranged inside said case to accommodate said battery, and means for closing said housing including a removable cover able to be mechanically locked onto the case, this timepiece further including connecting means, arranged partly in said housing, for allowing electric access to electric or electronic components of the timepiece housed within said case, wherein said connecting means include a plurality of connection terminals arranged in said housing at the periphery of said battery, said housing being arranged so that said connection terminals are accessible from outside said case after the removal of said removable cover, without requiring said battery to be removed from said housing.

2. A timepiece according to claim 1, further including an electronic module including a printed circuit carrying at least a part of said electric or electronic components, said connecting means including a plurality of conductive paths formed on said printed circuit and connected to said connection terminals.

3. A timepiece according to claim 2, wherein said electric or electronic components are accessible via an integrated circuit carried by said electronic module.

4. A timepiece according to claim 3, wherein said connection terminals give access to a serial port of said integrated circuit via which tests of and/or adjustments to said electric or electronic components are executed.

5. A timepiece according to claim 1, further including a decoding logic including at least a part of said connection terminals as inputs.

6. A timepiece according to claim 2, wherein said electronic module includes an opening shaped to fit the periphery of said battery, and at the periphery of which said connection terminals are arranged.

7. A timepiece according to claim 2, wherein said printed circuit is arranged substantially in the same plane as said battery.

8. An electronic module intended to be mounted in an electronic or electromechanical device powered by an electric power source formed by a battery, this battery being housed in a battery compartment of said device, including a housing for accommodating said battery and means for closing said housing including a removable cover, wherein said electronic module includes a plurality of connection terminals arranged so as to be located at the periphery of said battery, and to be accessible from outside said device after the removal of said removable cover, without requiring the battery to be removed from said housing, these connection terminals allowing electric access to electric or electronic components of said electronic module.

9. An electronic module according to claim 8, including an opening shaped to fit the periphery of said battery, and at the periphery of which said connection terminals are arranged.

* * * * *